United States Patent
Chou et al.

(10) Patent No.: US 12,463,593 B2
(45) Date of Patent: Nov. 4, 2025

(54) POWER DETECTOR DEVICE AND METHOD OF CALIBRATING DETECTION POWER RANGE

(71) Applicant: REALTEK SEMICONDUCTOR CORPORATION, Hsinchu (TW)

(72) Inventors: Chien-I Chou, Hsinchu (TW); Ling Lee, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 806 days.

(21) Appl. No.: 17/744,963

(22) Filed: May 16, 2022

(65) Prior Publication Data

US 2022/0393647 A1 Dec. 8, 2022

(30) Foreign Application Priority Data

Jun. 8, 2021 (TW) ................................ 110120826

(51) Int. Cl.
H03F 1/02 (2006.01)
(52) U.S. Cl.
CPC ......... *H03F 1/0222* (2013.01); *H03F 1/0238* (2013.01); *H03F 1/0266* (2013.01)
(58) Field of Classification Search
CPC ..... H03F 1/0222; H03F 1/0238; H03F 1/0266
USPC ...................................................... 330/250
See application file for complete search history.

(56) References Cited

U.S. PATENT DOCUMENTS

| 9,019,011 | B2 | 4/2015 | Hietala | |
| 9,793,871 | B1* | 10/2017 | Kim | H04B 1/0475 |
| 2002/0175751 | A1* | 11/2002 | McMorrow | H03G 3/3042 |
| | | | | 330/129 |
| 2010/0112967 | A1* | 5/2010 | Sorensen | H04B 1/1607 |
| | | | | 455/127.1 |
| 2012/0306572 | A1* | 12/2012 | Hietala | H03F 1/32 |
| | | | | 330/131 |

(Continued)

OTHER PUBLICATIONS

OA letter of a counterpart TW application (appl. No. 110120826) mailed on Nov. 22, 2021. Summary of the OA letter: 1. Claims 1 and 10 are rejected as allegedly being unclear.2. Claims 1 and 10 are rejected as allegedly being unpatentable over cited reference 1 (U.S. Pat. No. 9,019,011B2).3. Claims 2-9 are allowable.Correspondence bewteen claims of TW counterpart application and claims of US application:1. Claims 1-4 and 5-10 in TW counterpart application correspond to claims 1-4 and 6-11 in US application, respectively.

(Continued)

*Primary Examiner* — Hafizur Rahman
(74) *Attorney, Agent, or Firm* — WPAT, PC

(57) ABSTRACT

A power detector device includes a power detector circuit, a filter circuit, and a calibration circuitry. The power detector circuit is configured to detect a first signal to generate a second signal. The filter circuit is configured to filter the second signal to generate a third signal. The calibration circuitry is configured to determine first signal strength information in response to the third signal, adjust a gain of the power detector circuit to obtain second signal strength information, and combine the first signal strength information and the second signal strength information, in order to calibrate a detection power range of the power detector circuit to be linear.

18 Claims, 7 Drawing Sheets

(56) References Cited

U.S. PATENT DOCUMENTS

2020/0076515 A1* 3/2020 Jain .................... G06F 1/3206

OTHER PUBLICATIONS

Y.-H. Chung et al., "A dual-band 802.11abgn/ac transceiver with integrated PA and T/R switch in a digital noise controlled SoC," 2015 IEEE Custom Integrated Circuits Conference (CICC), 2015, pp. 1-8, doi: 10.1109/CICC.2015.7338361.
B. Francois and p. Reynaert, "3.3 A transformer-coupled true-RMS power detector in 40nm CMOS," 2014 IEEE International Solid-State Circuits Conference Digest of Technical Papers (ISSCC), 2014, pp. 62-63, doi: 10.1109/ISSCC.2014.6757338.

* cited by examiner

POWER DETECTOR DEVICE AND METHOD OF CALIBRATING DETECTION POWER RANGE

BACKGROUND OF THE INVENTION

1. Field of the Invention

The present disclosure relates to a power detector device, especially to a power detector device and a method of calibrating detection power range that are applied to a transmitter.

2. Description of Related Art

In practical applications, with impacts from environmental condition(s) (e.g., temperature) and variations of antenna impedance, the output power of a transmitter circuit are varied to exceed a tolerance range of a communication protocol standard. A power detector circuit is employed to detect the output power of the transmitter circuit, in order to instantly adjust the output power of the transmitter circuit. However, the existing power detector circuit may be over-saturated due to higher output power or may have a small detection power range, and is thus not suitable for multiple communication applications.

SUMMARY OF THE INVENTION

In some aspects of the present disclosure, a power detector device includes a power detector circuit, a filter circuit, and a calibration circuitry. The power detector circuit is configured to detect a first signal to generate a second signal. The filter circuit is configured to filter the second signal to generate a third signal. The calibration circuitry is configured to determine first signal strength information in response to the third signal, adjust a gain of the power detector circuit to obtain second signal strength information, and combine the first signal strength information and the second signal strength information, in order to calibrate a detection power range of the power detector circuit to be linear.

In some aspects of the present disclosure, a method of calibrating detection power range includes the following operations: detecting, by a power detector circuit, a first signal to generate a second signal; filtering the second signal to generate a third signal; determining first signal strength information in response to the third signal; and adjusting a gain of the power detector circuit to obtain second signal strength information, and combining the first signal strength information and the second signal strength information to calibrate a detection power range of the power detector circuit to be linear.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
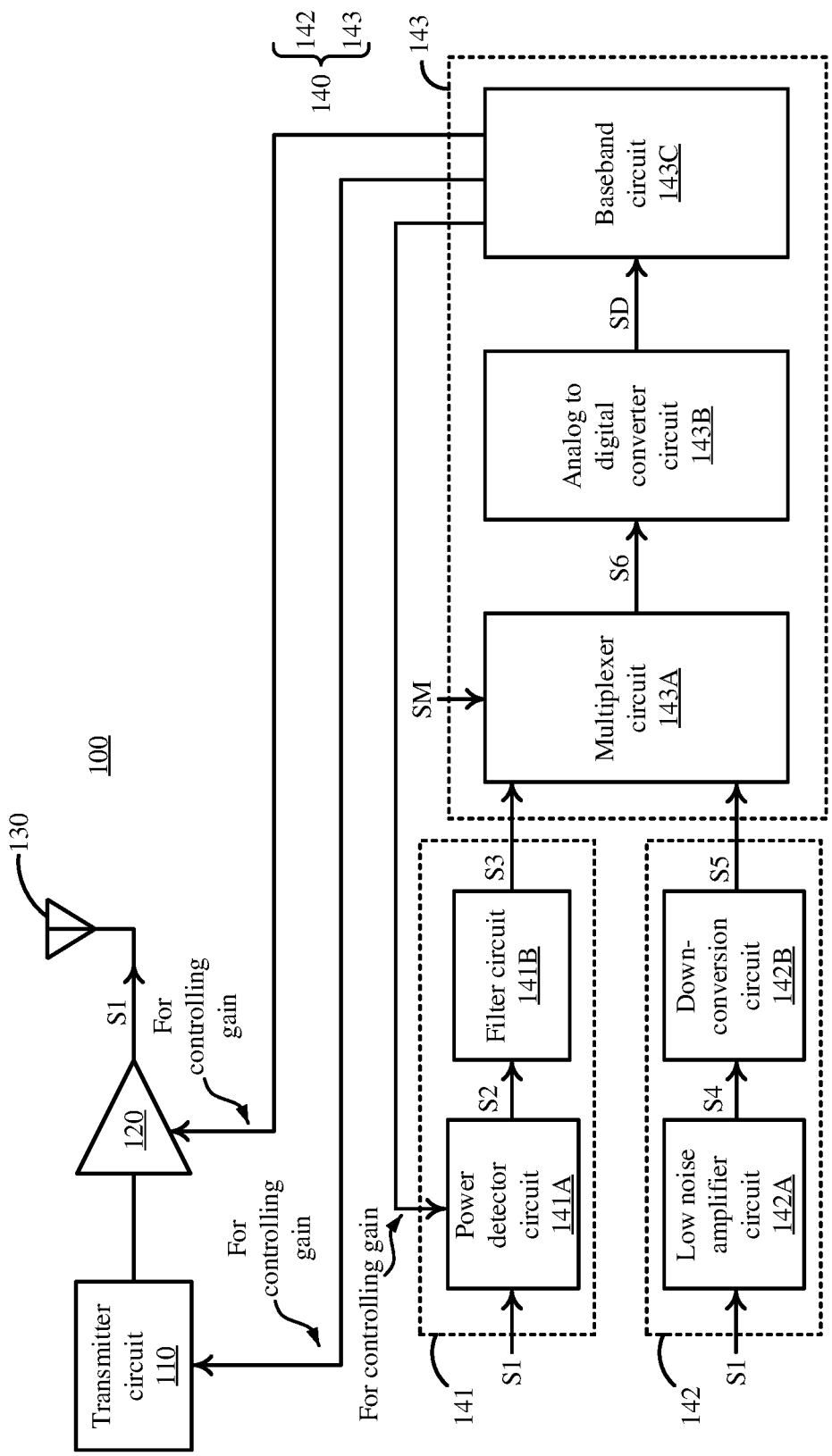
FIG. 1 is a schematic diagram a schematic diagram of a transmission system according to some embodiments of the present disclosure.

FIG. 1 is a schematic diagram of a transmission system 100 according to some embodiments of the present disclosure. The transmission system 100 includes a transmitter circuit 110, a power amplifier circuit 120, an antenna 130, a receiver circuit 140 and a signal path 141. The transmitter circuit 110 may transmit a signal S1 via the power amplifier circuit 120 and the antenna 130. The receiver circuit 140 includes a signal path 142 and a calibration circuitry 143. The signal path 141 is configured to cooperate with the calibration circuitry 143 to operate as a power detector which can be configured to calibrate a gain of the transmitter circuit 110 (and/or the power amplifier circuit 120). The signal path 142 can be considered as a receiver path which may receive signals from the transmitter circuit 110 via the antenna 130 for subsequent circuits or devices.

In greater detail, the signal path 141 includes a power detector circuit 141A and a filter circuit 141B. In some embodiments, the power detector circuit 141A is configured to detect the signal S1 to generate a signal S2. In some embodiments, the power detector circuit 141A may be, but not limited to, an envelope detector circuit or a peak detector circuit. In some embodiments, based on the control of the calibration circuitry 143, the gain of the power detector circuit 141A can be adjusted. For example, based on the control of the calibration circuitry 143, the biasing of the power detector circuit 141A can be adjusted, in order to set the gain of the power detector circuit 141A. The above adjustments of the gain of the power detector circuit 141A are given for illustrative purposes, and the present disclosure is not limited thereto. The filter circuit 141B is configured to filter the signal S2 to generate a signal S3. In some embodiments, the filter circuit 141B may be, but not limited to, a low-pass filter circuit or a band-pass filter circuit. The signal path 142 includes a low noise amplifier circuit 142A and a down-conversion circuit 142B. The low noise amplifier circuit 142A is configured to process the signal S2 to generate a signal S4. The down-conversion circuit 142B is configured to modulate the signal S4 (e.g., lowering the frequency of the signal S4) to generate a signal S5. In some embodiments, the down-conversion circuit 142B may be, but not limited to, a mixer circuit.

As mentioned above, the calibration circuitry 143 is a circuit portion of the receiver circuit 140. When the calibration circuitry 143 receives the signal S3 from the signal path 141, the calibration circuitry 143 may adjust the gain of the transmitter circuit 110 (and/or the power amplifier circuit 120). Before the transmission begins, the calibration circuitry 143 may adjust the gain of the power detector circuit 141A to obtain the signals S3 having different power, and obtain multiple signal strength information in response to the signals S3, in order to calibrate a detection power range of the power detector circuit 141A to be linear. When the calibration circuitry 143 receives the signal S5 from the signal path 142, the calibration circuitry 143 may process the signal S5 for subsequent signal processing.

In some embodiments, the calibration circuitry 143 includes a multiplexer circuit 143A, an analog to digital converter circuit 143B, and a baseband circuit 143C. The multiplexer circuit 143A is configured to selectively receive the signals S3 from the signal path 141 or the signal S5 from the signal path 142 according to a mode signal SM, and output the received signal to be a signal S6. For example, when the mode signal SM has a first logic value (e.g., a logic value of 1), the multiplexer circuit 143A outputs the signal S3 to be the signal S6. Under this condition, the calibration circuitry 143 operates in a calibration mode to adjust the gain of the transmitter circuit 110 (and/or the power amplifier circuit 120). When the mode signal SM has a second logic value (e.g., a logic value of 0), the multiplexer circuit 143A outputs the signal S5 to be the signal S6. Under this condition, the calibration circuitry 143 operates in a normal mode to perform a data processing on the signal S5 from the signal path 142.

The analog to digital converter circuit 143B converts the signal S6 into a digital signal SD. When the signal S6 is the signal S5 (i.e., operates in the normal mode), the baseband circuit 143C may be configured to process the digital signal SD for subsequent signal processing. Alternatively, when the signal S6 is the signal S3 (i.e., operates in the calibration mode), the baseband circuit 143C may be configured to analyze the digital signal SD to obtain multiple signal strength information (which are referred to as "signal strength information $I_1$-$I_n$" hereinafter), and combine the signal strength information $I_1$-$I_n$ to calibrate the detection power range of the power detector circuit 141A to be linear. Detailed descriptions regarding herein will be provided with reference FIG. 2A to FIG. 2C. In some embodiments, the baseband circuit 143C may include, but not limited to, a digital signal processor circuit (not shown in the figures) and a register circuit (not shown in the figures). The digital signal processor circuit may be configured to analyze the digital signal SD to obtain the signal strength information $I_1$-$I_n$. The register circuit may store the signal strength information $I_1$-$I_n$ and related parameters (e.g., a predetermined slope value $S_{ideal}$, an offset value b, an offset value $K_1$-$K_n$, and so on as discussed below).

The baseband circuit 143C may control the gain of the transmitter circuit 110 and/or the power amplifier circuit 120, in order to meet requirements of different communication protocol standards. In some embodiments, the signal strength information $I_1$-$I_n$ may be transmitter signal strength indicators (TSSIs). Before the transmission begins, the baseband circuit 143C may provide the TSSI to subsequent circuit(s), such the subsequent circuit(s) can acquire the current TSSI and adjust circuit configuration(s) thereof accordingly. In general, the greater the detection power range of the power detector circuit 141A, the more suitable communication applications. If the output power of the transmitter circuit 110 (and/or the power amplifier circuit 120) is higher, the power detector circuit 141A is set to have a higher gain; otherwise, at a fixed gain, the power detector circuit 141A may be oversaturated with the signal S1 having excessive power, and thus cannot correctly determine the output power of the transmitter circuit 110. In some embodiments, in order to avoid the above situation, the baseband circuit 143C may adjust the gain of the power detector circuit 141A to generate the signal strength information $I_1$-$I_n$ when operating in the calibration mode, and combine the signal strength information $I_1$-$I_n$ to calibrate the detection power range of the power detector circuit 141A. As a result, the detection power range of the power detector circuit 141A can be increased linearly.

Figure 2A:
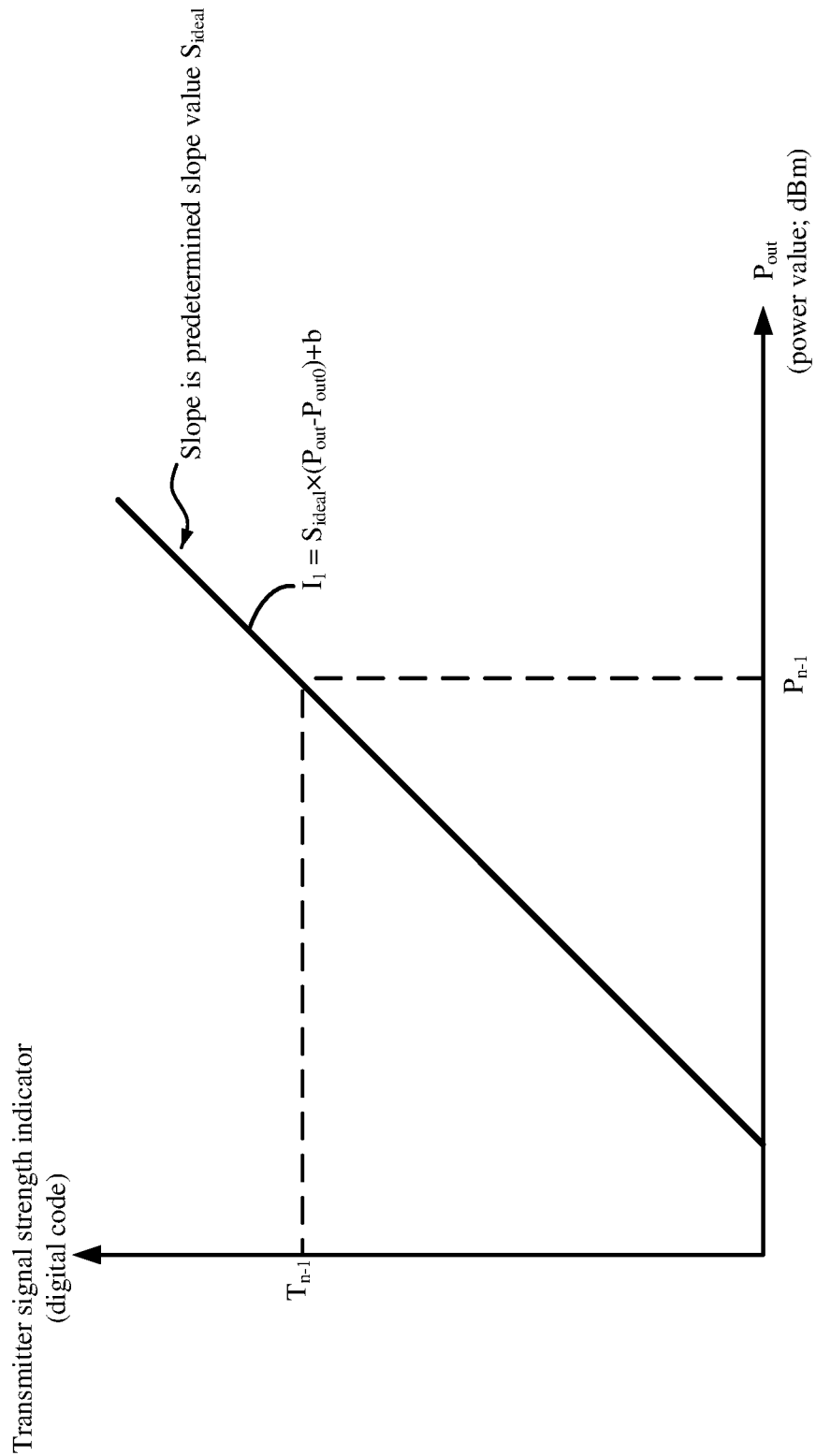
FIG. 2A is a schematic diagram of the signal strength information according to some embodiments of the present disclosure.
Figure 2B:
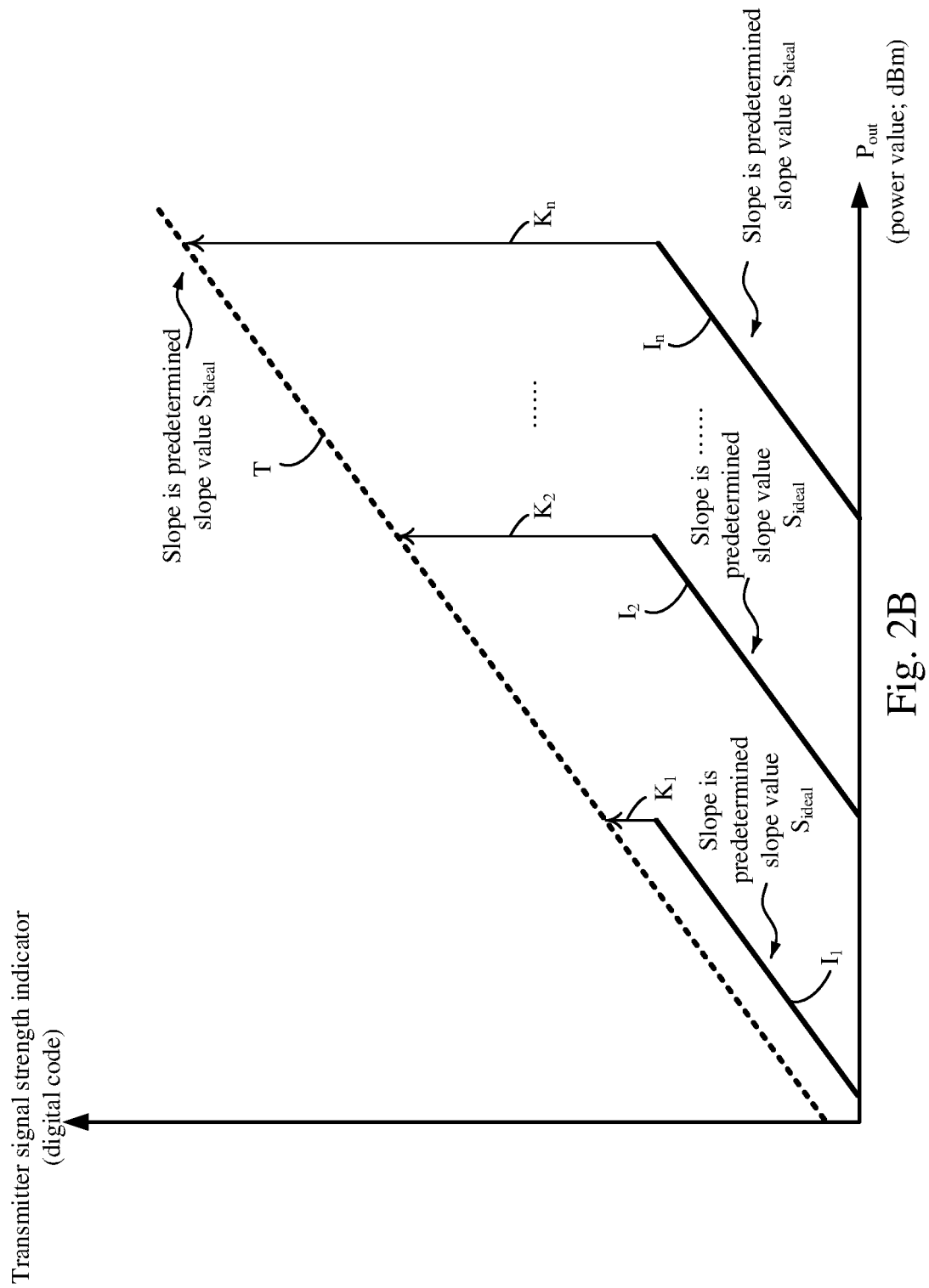
FIG. 2B is a schematic diagram illustrating a calibration of the signal strength information according to some embodiments of the present disclosure.
Figure 2C:
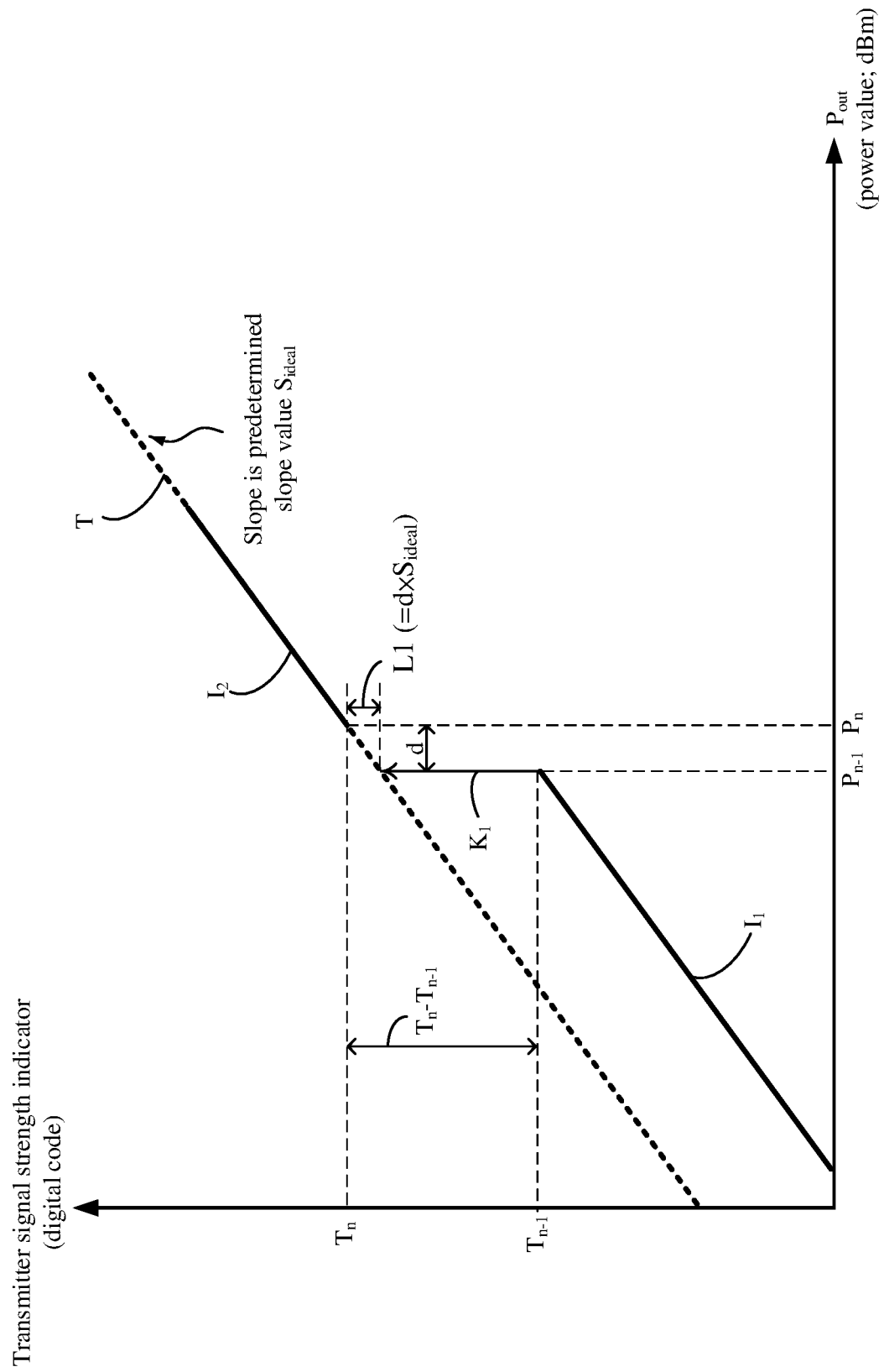
FIG. 2C is a schematic diagram illustrating calculation of the offset value according to some embodiments of the present disclosure.
Figure 3A:
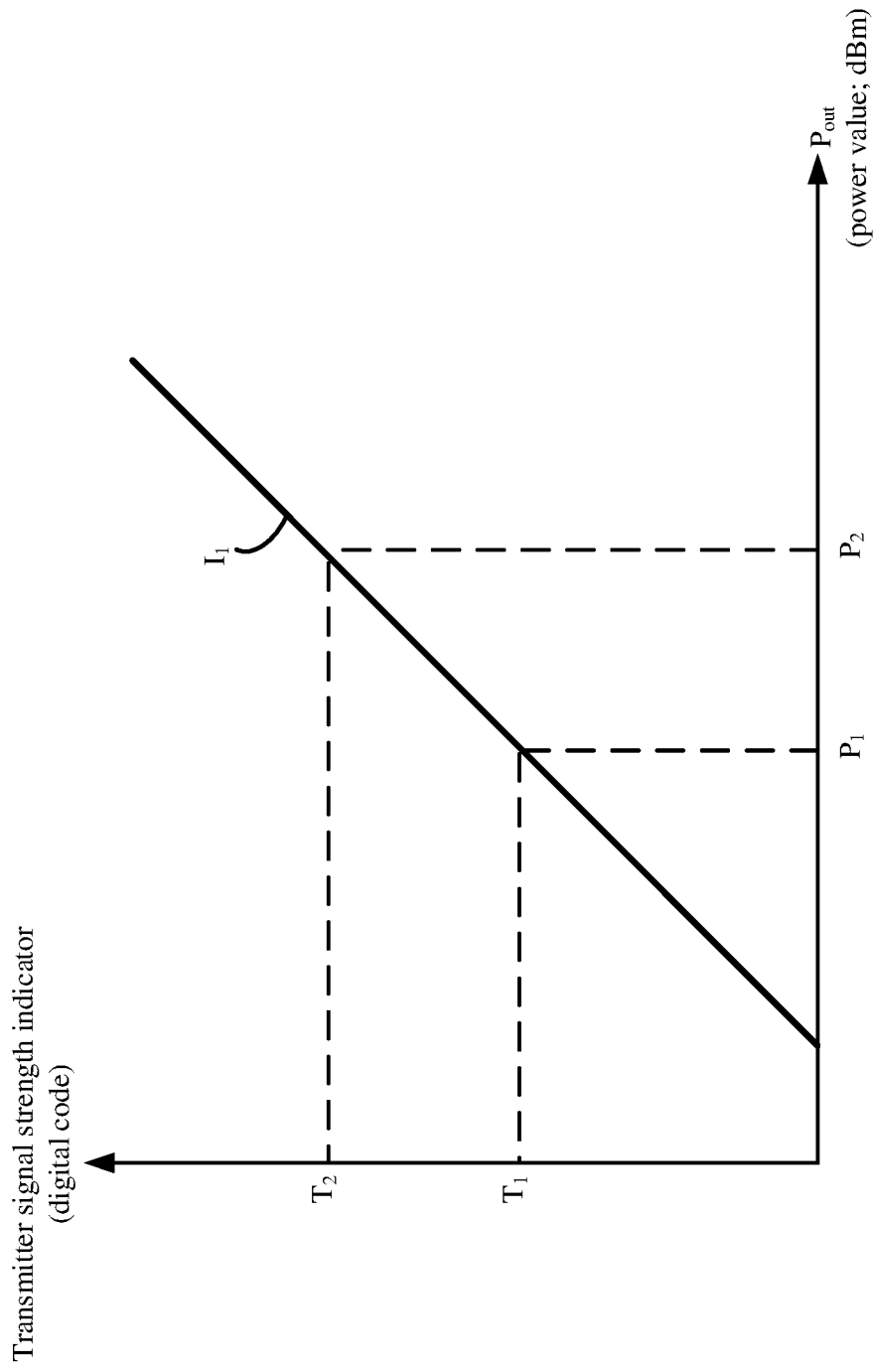
FIG. 3A is a schematic diagram of the signal strength information according to some embodiments of the present disclosure.
Figure 3B:
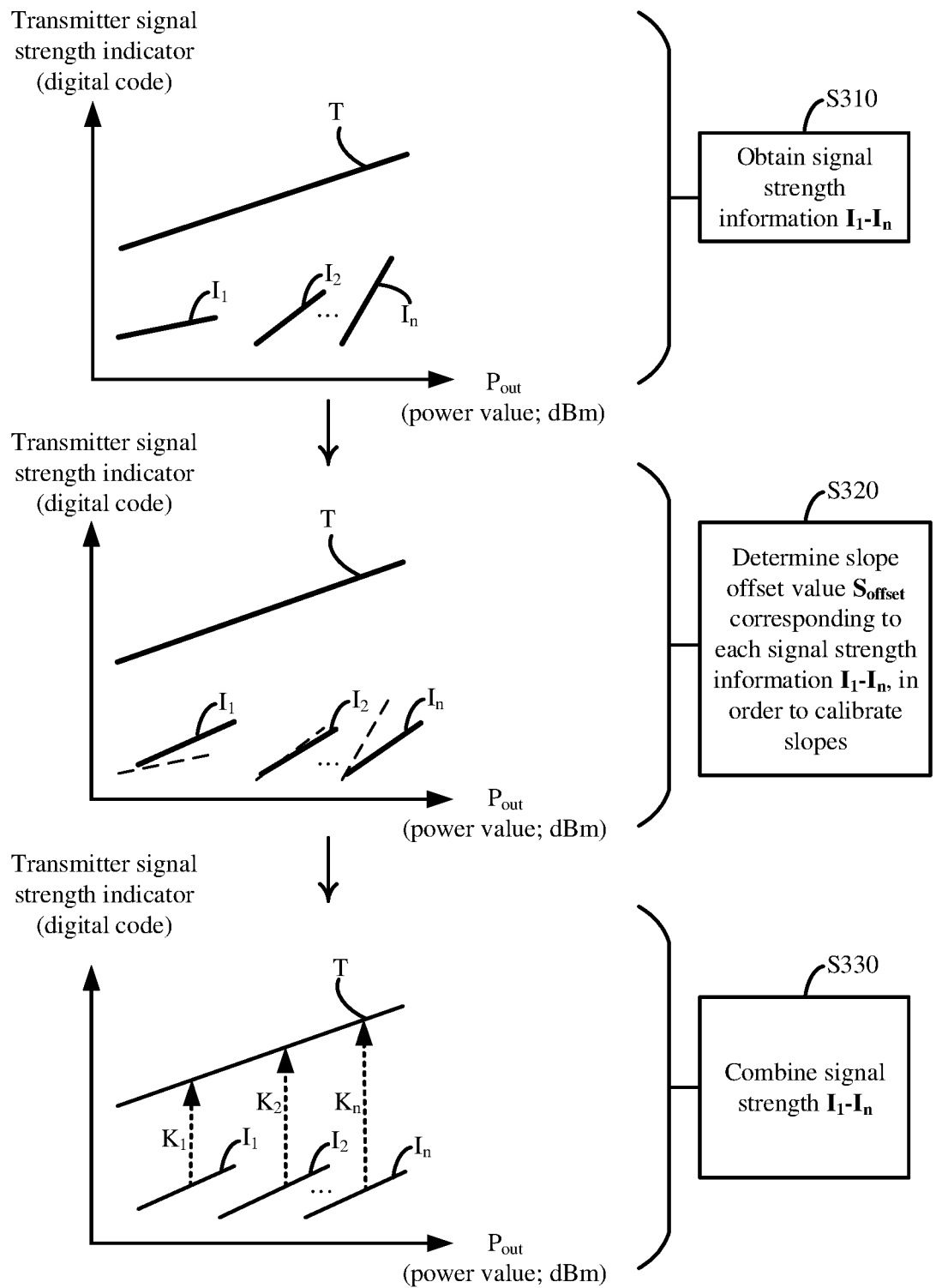
FIG. 3B is a schematic diagram illustrating a calibration of slopes of the signal strength information according to some embodiments of the present disclosure.

In some embodiments, the baseband circuit 143C may perform operations in FIG. 2A to FIG. 2C or those in FIG. 3A to FIG. 3B. FIG. 2A is a schematic diagram of the signal strength information $I_1$ according to some embodiments of the present disclosure. Under the condition that the power detector circuit 141A has a first gain, the baseband circuit 143C may obtain a power value $P_{out}$ (which is equivalent to the current output power of the transmitter circuit 110) according to the digital signal SD which is converted from the signal S3, and obtain the signal strength information $I_1$ according to the power value $P_{out}$, a predetermined slope value $S_{ideal}$, an offset value b and an offset value $K_1$. In this example, the predetermined slope value $S_{ideal}$ and the offset value b are fixed parameters that are stored in advance, and the offset value $K_1$ is obtained by calculation shown in FIG. 2C. For example, the predetermined slope value $S_{ideal}$ and the offset value b can be estimated by measuring existing circuit(s), and are stored in the baseband circuit 143C in advance. In some embodiments, the predetermined slope value $S_{ideal}$ may be, but not limited to, 8. In some embodiments, the signal strength information $I_1$ is a sum of a first value and the offset value b, in which the first value is a product of a difference between the power value $P_{out}$ and an initial power value $P_{out0}$ (which may be zero or initial power of the transmitter circuit 110) and the predetermined slope value $S_{ideal}$. In other words, the signal strength information $I_1$ can be expressed as follows:

$$I_1 = S_{ideal} \times (P_{out} - P_{out0}) + b$$

After obtaining the signal strength information $I_1$ corresponding to the first gain, the baseband circuit 143C may adjust the gain of the power detector circuit 141A to be a second gain, and utilize similar operations to obtain the signal strength information $I_2$ corresponding to the second gain. With this analogy, the baseband circuit 143C may obtain the signal strength information $I_1$-$I_n$ corresponding to different gains.

FIG. 2B is a schematic diagram illustrating a calibration of the signal strength information $I_1$-$I_n$ according to some embodiments of the present disclosure. As shown in FIG. 2B, after obtaining the signal strength information $I_1$-$I_n$, the baseband circuit 143C may utilize offset values $K_1$-$K_n$, to shift the signal strength information $I_1$-$I_n$, respectively. As a result, the signal strength information $I_1$-$I_n$ are able to be aligned with a line segment T. For example, the baseband circuit 143C may add the offset value $K_1$ to the signal strength information $I_1$, such that the signal strength information $I_1$ is shifted to be aligned with the line segment T. The baseband circuit 143C may add the offset value $K_2$ to the signal strength information $I_2$, such that the signal strength information $I_2$ is shifted to be aligned with the line segment T. The baseband circuit 143C may add the offset value $K_2$, to the signal strength information $I_n$, such that the signal strength information $I_n$ is shifted to be aligned with the line segment T. Equivalently, the baseband circuit 143C utilizes the offset value $K_1$-$K_n$, to combine the signal strength information in order to expand the detection power range of the power detector circuit 141A and keep the linearity of the detection power range.

FIG. 2C is a schematic diagram illustrating calculation of the offset value $K_1$ according to some embodiments of the present disclosure. With impacts from systematic error(s) or variation(s) of practical circuits, the offset values $K_1$-$K_2$, may not be fixed values. In some embodiments, the baseband circuit 143C may utilize two of the signal strength information $I_1$-$I_n$ to calculate the offset value $K_1$. For example, After the baseband circuit 143C calibrates the transmitter circuit 110 and the power amplifier circuit 120, the baseband circuit 143C may adjust the gain of the transmitter circuit 110 and/or the power amplifier circuit 120, such that the power amplifier circuit 120 sequentially outputs the signal S1 having power $P_{n-1}$ and the signal S1 having power $P_n$. According to the signal strength information $I_1$, the baseband circuit 143C may obtain that when the power value $P_{out}$ is $P_{n-1}$, the corresponding TSSI is $T_{n-1}$. According to the signal strength information $I_2$, the baseband circuit 143C may obtain that when the power value $P_{out}$ is $P_n$, the corresponding TSSI is $T_n$. As a result, the baseband circuit 143C may obtain the offset value $K_1$ according to the power value $P_{n-1}$, the signal strength indicator $T_{n-1}$, the power value $P_n$, the signal strength indicator $T_n$ and the predetermined slope value $S_{ideal}$. For example, as shown in FIG. 2C, the offset value $K_1$ is equal to a difference between the signal strength indicator $T_n$ and the signal strength indicator $T_{n-1}$ minus a value L1, in which the value L1 is a product of a value d and the predetermined slope value $S_{ideal}$ (i.e., $d \times S_{ideal}$), and the value d is a difference between the power value $P_n$ and the power value $P_{n-1}$. In other words, the offset value $K_1$ can be expressed as follows:

$$K_1 = (T_n - T_{n-1}) - d \times S_{ideal} = (T_n - T_{n-1}) - (P_n - P_{n-1}) \times S_{ideal}$$

With the above calculation, the baseband circuit 143C may obtain a more accurate offset value $K_1$. With this analogy, the baseband circuit 143C is able to utilize two of the signal strength information $I_2$-$I_n$ to determine the remaining offset values $K_2$-$K_n$.

FIG. 3A is a schematic diagram of the signal strength information $I_1$ according to some embodiments of the present disclosure. In the above embodiments, the signal strength information $I_1$-$I_n$ are predetermined to have the predetermined slope value $S_{ideal}$. In some embodiments, according to systematic error(s) or variation(s) of practical circuits, the slopes of the signal strength information $I_1$-$I_n$ may be different from each other (as shown in operation S310 in FIG. 3B). In order to calibrate the detection power range more accurately, under the condition that the gain of the power detector circuit 141A is fixed, the baseband circuit 143C may obtain the power value $P_1$ and the signal strength indicator $T_1$ Corresponding to the power value $P_1$ according to the digital signal SD which is converted from the signal S3. Afterwards, the baseband circuit 143C may control the transmitter circuit 110 (and/or the power amplifier circuit 120) to output the signal S3 having higher power. The baseband circuit 143C may obtain the power value $P_2$ (which is greater than the power value $P_1$) and the signal strength indicator $T_2$ corresponding to the power value $P_2$. The baseband circuit 143C may determine a slope offset value $S_{offset}$ according to the power value $P_1$, the signal strength indicator $T_1$, the power value $P_2$ and the signal strength indicator $T_2$, and calibrate the predetermined slope value $S_{ideal}$ according to the slope offset value $S_{offset}$ to obtain a calibrated slope value S. The slope offset value $S_{offset}$ is a ratio of a first difference to a second difference, in which the first difference is a difference between the power value $P_2$ and the power value $P_1$, and the second difference is a difference between the signal strength indicator $T_2$ and the signal strength indicator $T_1$. In other words, the slope offset value $S_{offset}$ may be expressed as follows:

$$S_{offset} = \frac{P_2 - P_1}{T_2 - T_1}$$

FIG. 3B is a schematic diagram illustrating a calibration of slopes of the signal strength information $I_1$-$I_n$ according to some embodiments of the present disclosure. After obtaining the slope offset value $S_{offset}$, the baseband circuit 143C may calibrate the predetermined slope value $S_{ideal}$ according to the slope offset value $S_{offset}$ to obtain the calibrated slope value S. For example, the slope of the signal strength information $I_1$ can be calibrated to be the calibrated slope value S, which may be a product of the predetermined slope value $S_{ideal}$ and the slope offset value $S_{offset}$. In other words, the calibrated slope value can be expressed as follows:

$$S = S_{ideal} \times S_{offset} = S_{ideal} \times \left[ \frac{P_2 - P_1}{T_2 - T_1} \right]$$

As shown in operation S320 of FIG. 3B, the calibrated slope of the signal strength information $I_1$ can be close to (or equal to) the slope of the line segment T. Afterwards, the baseband circuit 143C may adjust the gain of the power amplifier circuit 120, in order to obtain the signal strength information $I_2$-$I_n$ corresponding to different gains of the power amplifier circuit 120 (or the power detector circuit 141A). With the similar operations, the baseband circuit 143C may obtain the slope offset value $S_{offset}$ and the calibrated slope value S corresponding to each of the remaining signal strength information $I_2$-$I_n$, in order to calibrate the slopes of the remaining signal strength information $I_2$-$I_n$ (i.e., operation S320; in which dotted lines are the signal strength information $I_1$-$I_n$ before calibrated). As a result, the baseband circuit 143C is able to continue performing operations in FIG. 2B and FIG. 2C, in order to combine the signal strength information $I_1$-$I_n$ to be the line segment T (i.e., operation S330).

Figure 4:
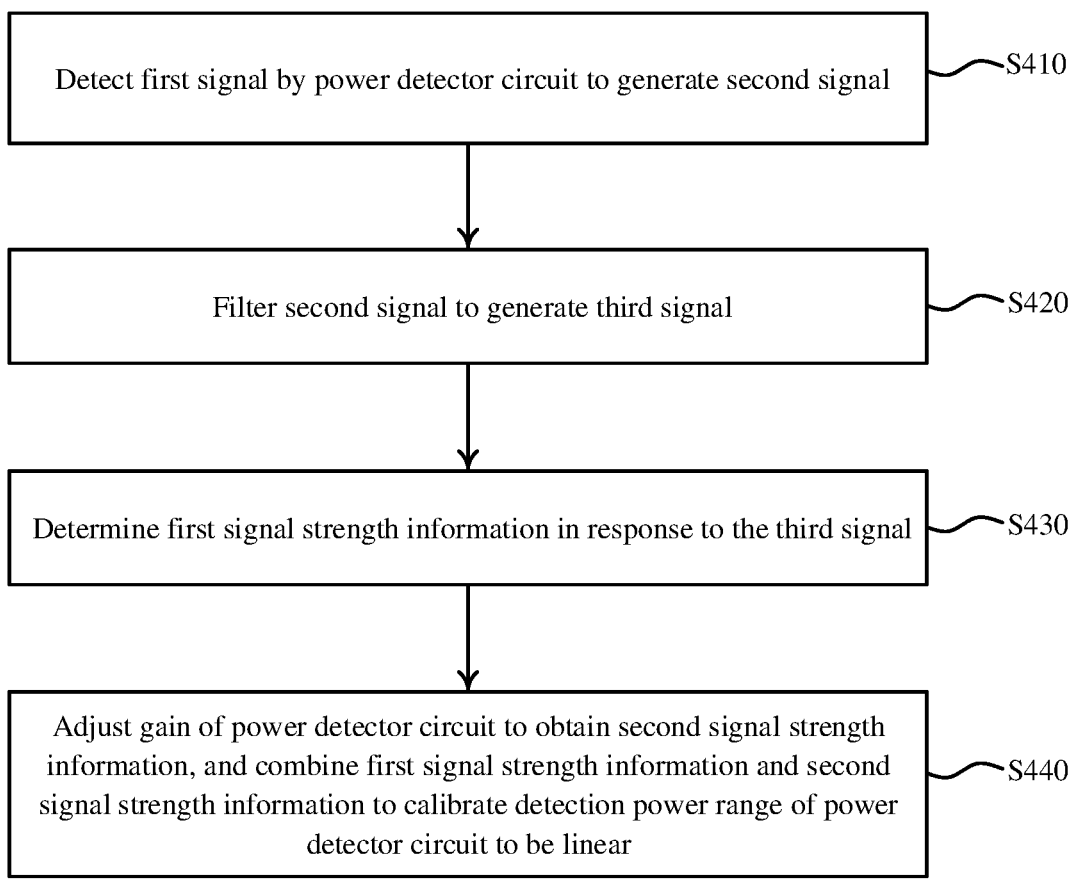
FIG. 4 is a flowchart of a method of calibrating detection power range according to some embodiments of the present disclosure.

FIG. 4 is a flowchart of a method 400 of calibrating detection power range according to some embodiments of the present disclosure. In operation S410, a first signal (e.g., the signal S1) is detected by a power detector circuit to generate a second signal (e.g., the signal S2). In operation S420, the second signal is filtered to generate a third signal (e.g., the signal S3). In operation S430, first signal strength information (e.g., the signal strength information L) is determined in response to the third signal. In operation S440, the gain of the power detector circuit is adjusted to obtain second signal strength information (e.g., the signal strength information 12) and the first signal strength information and the second signal strength information are combined to calibrate the detection power range of the power detector circuit to be linear.

The above operations can be understood with reference to the above embodiments, and thus the repetitious descriptions are not given. The above description of the method 400 of calibrating detection power range includes exemplary operations, but the operations of the method 400 of calibrating detection power range are not necessarily performed in the order described above. Operations of the method 400 of calibrating detection power range can be added, replaced, changed order, and/or eliminated, or the operations of the method 400 of calibrating detection power range can be executed simultaneously or partially simultaneously as appropriate, in accordance with the spirit and scope of various embodiments of the present disclosure.

As described above, the power detector device and a method of calibrating detection power range in some embodiments of the present disclosure may adjust the gain of the power detector, in order to combine multiple signal strength information into a single segment. As a result, the detection power range of the power detector circuit can be expanded linearly.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A power detector device, comprising:
a power detector circuit configured to detect a first signal to generate a second signal;
a filter circuit configured to filter the second signal to generate a third signal; and
a calibration circuitry configured to determine first signal strength information in response to the third signal, adjust a gain of the power detector circuit to obtain second signal strength information, and combine the first signal strength information and the second signal strength information, in order to calibrate a detection power range of the power detector circuit to be linear,
wherein the calibration circuitry is a circuit portion in a receiver circuit, and the calibration circuitry comprises:
a multiplexer circuit configured to selectively output the third signal or a fourth signal from the receiver circuit to be a fifth signal;
an analog to digital converter circuit configured to convert the fifth signal into a digital signal; and
a baseband circuit configured to analyze the digital signal to obtain the first signal strength information and the second signal strength information, and combine the first signal strength information and the second signal strength information to calibrate the detection power range.

2. The power detector device of claim 1, wherein the calibration circuitry is configured to obtain a first power value according to the third signal, and obtain the first signal strength information according to the first power value, a predetermined slope value, and a first offset value.

3. The power detector device of claim 2, wherein the calibration circuitry is configured to obtain a second power value, which is higher than the first power value, according to the third signal, determine a slope offset value according to the first power value, a first transmitter signal strength indicator corresponding to the first power value, the second power value, and a second transmitter signal strength indicator corresponding to the second power value, calibrate the predetermined slope value according to the slope offset value to generate a calibrated slope value, and utilize the calibrated slope value to calibrate the first signal strength information.

4. The power detector device of claim 2, wherein the first signal strength information is a sum of a first value and the first offset value, and the first value is a product of the predetermined slope value and a difference between the first power value and an initial power value.

5. The power detector device of claim 4, wherein the initial power value is zero or initial power of a transmitter circuit.

6. The power detector device of claim 2, wherein the calibration circuitry is further configured to utilize a second offset value to shift the first signal strength information.

7. The power detector device of claim 6, wherein the calibration circuitry is configured to obtain a second power value according to the third signal after the gain is adjusted, and obtain the second offset value according to the first power value, a first transmitter signal strength indicator corresponding to the first power value, the second power value, and a second transmitter signal strength indicator corresponding to the second power value.

8. The power detector device of claim 7, wherein the calibration circuitry is configured to subtract a second value from a difference between the first transmitter signal strength indicator and the second transmitter signal strength indicator to obtain the second offset value, and the second value is a product of the predetermined slope value and a difference between the first power value and the second power value.

9. The power detector device of claim 3, wherein the slope offset value is a ratio of a first difference and a second difference, the first difference is a difference between the second power value and the first power value, and the second difference is a difference between the second transmitter signal strength indicator and the first transmitter signal strength indicator.

10. A method of calibrating detection power range, comprising:
   detecting, by a power detector circuit, a first signal to generate a second signal;
   filtering the second signal to generate a third signal;
   determining first signal strength information in response to the third signal; and
   adjusting a gain of the power detector circuit to obtain second signal strength information, and combining the first signal strength information and the second signal strength information to calibrate a detection power range of the power detector circuit to be linear,
   wherein combining the first signal strength information and the second signal strength information to calibrate the detection power range of the power detector circuit to be linear comprises:
   selectively outputting the third signal or a fourth signal from a receiver circuit to be a fifth signal;
   converting the fifth signal into a digital signal; and
   analyzing the digital signal to obtain the first signal strength information and the second signal strength information, and combining the first signal strength information and the second signal strength information to calibrate the detection power range.

11. The method of calibrating detection power range of claim 10, wherein determining the first signal strength information in response to the third signal comprises:
   obtaining a first power value according to the third signal; and
   obtaining the first signal strength information according to the first power value, a predetermined slope value, and a first offset value.

12. The method of calibrating detection power range of claim 11, further comprising:
   obtaining a second power value higher than the first power value according to the third signal;
   determining a slope offset value according to the first power value, a first transmitter signal strength indicator corresponding to the first power value, the second power value, and a second transmitter signal strength indicator corresponding to the second power value; and
   calibrating the predetermined slope value according to the slope offset value to generate a calibrated slope value, and utilizing the calibrated slope value to calibrate the first signal strength information.

13. The method of calibrating detection power range of claim 12, wherein the slope offset value is a ratio of a first difference and a second difference, the first difference is a difference between the second power value and the first power value, and the second difference is a difference between the second transmitter signal strength indicator and the first transmitter signal strength indicator.

14. The method of calibrating detection power range of claim 11, wherein the first signal strength information is a sum of a first value and the first offset value, and the first value is a product of the predetermined slope value and a difference between the first power value and an initial power value.

15. The method of calibrating detection power range of claim 14, wherein the initial power value is zero or initial power of a transmitter circuit.

16. The method of calibrating detection power range of claim 11, further comprising:
   utilizing a second offset value to shift the first signal strength information.

17. The method of calibrating detection power range of claim 16, further comprising:
   obtaining a second power value according to the third signal after the gain is adjusted; and
   obtaining the second offset value according to the first power value, a first transmitter signal strength indicator corresponding to the first power value, the second power value, and a second transmitter signal strength indicator corresponding to the second power value.

18. The method of calibrating detection power range of claim 17, wherein obtaining the second offset value according to the first power value, the first transmitter signal strength indicator corresponding to the first power value, the second power value, and the second transmitter signal strength indicator corresponding to the second power value comprises:
   subtracting a second value from a difference between the first transmitter signal strength indicator and the second transmitter signal strength indicator to obtain the second offset value, wherein the second value is a product of the predetermined slope value and a difference between the first power value and the second power value.

* * * * *